(12) United States Patent
Ali

(10) Patent No.: US 9,184,758 B2
(45) Date of Patent: *Nov. 10, 2015

(54) SYSTEM AND METHOD OF ANALOG-TO-DIGITAL CONVERTERS

(71) Applicant: Analog Devices, Inc., Norwood, MA (US)

(72) Inventor: Ahmed Mohamed Abdelatty Ali, Oak Ridge, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 146 days.

This patent is subject to a terminal disclaimer.

(21) Appl. No.: 13/761,288

(22) Filed: Feb. 7, 2013

(65) Prior Publication Data

US 2013/0176152 A1 Jul. 11, 2013

Related U.S. Application Data

(63) Continuation of application No. 13/159,734, filed on Jun. 14, 2011, now Pat. No. 8,390,487.

(51) Int. Cl.
*H03M 1/06* (2006.01)
*H03M 1/10* (2006.01)
*H03M 1/16* (2006.01)

(52) U.S. Cl.
CPC .......... *H03M 1/1014* (2013.01); *H03M 1/1061* (2013.01); *H03M 1/164* (2013.01)

(58) Field of Classification Search
USPC .................... 341/120, 155.144, 161, 118
See application file for complete search history.

(56) References Cited

U.S. PATENT DOCUMENTS

| | | | |
|---|---|---|---|
| 5,638,071 A | 6/1997 | Capofreddi et al. |
| 6,304,205 B1 | 10/2001 | Rezvani et al. |
| 6,563,445 B1 | 5/2003 | Sabouri |
| 6,756,929 B1 | 6/2004 | Ali |
| 6,839,009 B1 | 1/2005 | Ali |
| 7,271,750 B1 | 9/2007 | Ali |
| 7,570,191 B2 | 8/2009 | Easwaran et al. |
| 7,602,323 B2 | 10/2009 | Galton et al. |
| 2002/0047790 A1 | 4/2002 | Ali |
| 2004/0066320 A1 | 4/2004 | Kobayashi |
| 2007/0194971 A1 | 8/2007 | Yamaji et al. |
| 2010/0073210 A1 | 3/2010 | Bardsley et al. |
| 2010/0073214 A1 | 3/2010 | Kawahito et al. |

OTHER PUBLICATIONS

PCT International Search Report fro PCT/US1238051, mailed on Jul. 13, 2012.

*Primary Examiner* — Peguy Jean Pierre
(74) *Attorney, Agent, or Firm* — Kenyon & Kenyon LLP

(57) ABSTRACT

An analog-to-digital converter system that includes a pipeline of successively-cascaded signal converters, each operating alternatively in a first circuit configuration and a second circuit configuration, an error estimator coupled to the pipeline to receive the digitized error for estimating an amplifier gain of the present signal converter stage, and a code aligner/corrector that temporally aligns and corrects the digital codes received from the successively-cascaded signal converters to provide a digital out of the ADC system.

20 Claims, 13 Drawing Sheets

SYSTEM AND METHOD OF ANALOG-TO-DIGITAL CONVERTERS

CROSS-REFERENCE TO RELATED APPLICATIONS

This is a Continuation Application of U.S. Utility application Ser. No. 13/159,734, filed Jun. 14, 2011, which is incorporated in its entirety.

FIELD OF THE INVENTION

The present invention is generally directed to analog-to-digital converters (ADCs). In particular, the present invention is directed to a system and method that may calibrate pipelined ADCs at summing nodes using signal converter stages in the main pipeline interleavingly.

BACKGROUND INFORMATION

Pipelined analog-to-digital converters (ADCs) may include a series of cascaded ADC stages each of which is responsible for converting a portion of an analog signal into digital codes. The digital codes of all portions of the analog signal may be eventually aligned to form a digital output representing the analog signal. Pipelined ADCs may be used in high-speed and high-resolution analog-to-digital conversion applications because the pipeline may break down the task of analog-to-digital conversion into a series of subtasks that may be performed at high sampling rates. Errors at earlier stages that commonly correspond to more significant bits may propagate downstream to subsequent stages. For example, U.S. Pat. No. 7,271,750 (the '750 patent, the content of which is incorporated by reference in its entirety) discusses errors caused by a finite amplifier gain. To correct these errors, the '750 patent introduces error extraction circuits to estimate the finite gain of the amplifier. In practice, the error extraction circuit may run at a slower clock than the high speed clock of the main pipeline. For example, the error extraction circuit may extract errors one out of every M (M is greater than or equal to 1) clock cycles for the gain estimation. The estimated gain may be used to calibrate the eventual digital output.

One limitation with the pipelined ADC as described in the '750 patent is that the ADC, in addition to the main pipeline, also may include an accessory pipeline for extracting signal error used in error calibration. The accessory pipeline may require additional circuit components to realize—which may mean more power consumption and needs for more circuit areas. Moreover, the accessory pipeline may operate according to a slow clock for error extraction. The slow clock when mixed with the fast sampling clock may cause degradations in the eventual digital outputs. Therefore, there is a need for systems and methods that are more advantageous than the existing approach of using the accessory pipeline.

DETAILED DESCRIPTION OF EXAMPLE EMBODIMENTS

Figure 1:
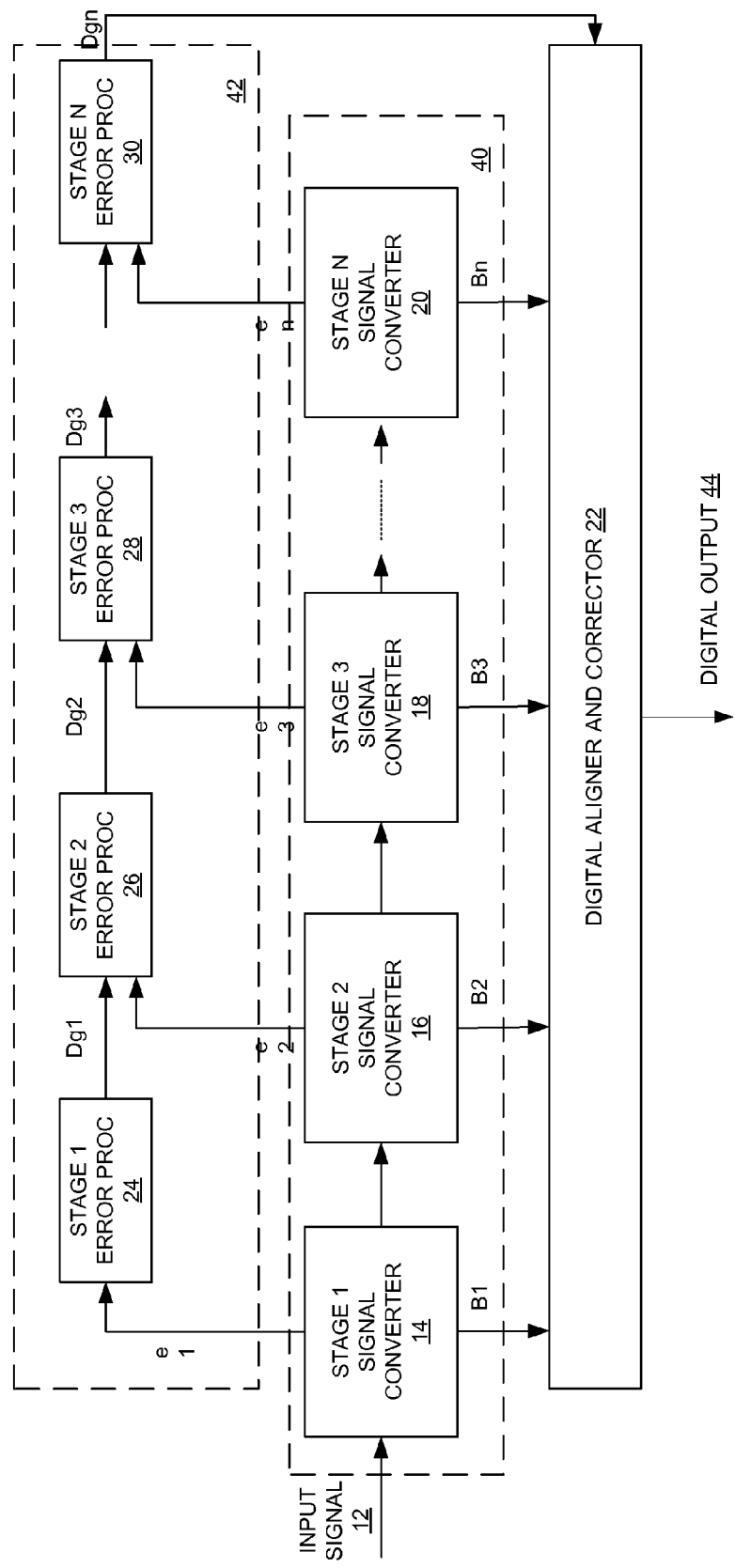
FIG. 1 illustrates a pipelined ADC with an accessory pipeline.

Embodiments of the present invention may be directed to an analog-to-digital converter system that includes a pipeline including successively-cascaded signal converter stages, in which each signal converter stage includes an analog-to-digital converter (ADC) for converting a portion of the input into digital codes and a multiplying digital-to-analog converter (MDAC) for passing a residual portion of the input to a following signal converter stage, the MDAC including an amplifier having a summing node and operating alternatively in a first circuit configuration and a second circuit configuration, in which for a present signal converter stage, a summing node error is capacitively extracted under the first configuration of the MDAC of the present signal converter stage, the extracted summing node error is amplified by the amplifier in a succeeding second configuration of the MDAC of the present signal converter stage to output an amplified error to a succeeding signal converter stage, and the amplified error is one of amplified in a second configuration of succeeding signal converter stages and digitized in a first configuration by the ADC starting from one of the succeeding signal converter stages. The ADC system further includes an error estimator coupled to the pipeline to receive the digitized error for estimating an amplifier gain of the present signal converter stage and a code aligner/corrector that temporally aligns and corrects the digital codes received from the successively-cascaded signal converters to provide a digital out of the ADC system.

Embodiments of the present invention may be directed to an analog-to-digital converter system that includes a pipeline including successively-cascaded signal converter stages, in which each signal converter stage includes an analog-to-digital converter (ADC) for converting a portion of the input into digital codes and a multiplying digital-to-analog converter (MDAC) for passing a residual portion of the input to a following signal converter stage, the MDAC including an amplifier having a summing node and operating alternatively in a first circuit configuration and a second circuit configuration, in which for a present signal converter stage, a summing node error is capacitively extracted under the first configuration of the MDAC of the present signal converter stage, the extracted summing node error is amplified by the amplifier in a succeeding second configuration of the MDAC of the present signal converter stage to output an amplified error to a succeeding signal converter stage, and the amplified error is one of amplified in a second configuration of succeeding signal converter stages and digitized in a first configuration by the ADC starting from one of the succeeding signal converter stages. The ADC system further includes an error estimator coupled to the pipeline to receive the digitized error for estimating an amplifier gain of the present signal converter stage in which the error estimator calculates a gain voltage that controls the present amplifier to work at a maximum gain regardless of changes in current supply and temperature.

FIG. 1 illustrates a pipelined ADC that includes a main pipeline 40 for signal conversion and an accessory pipeline 42 for error processing and calibration. The main pipeline 40 further may include a signal sampler (not shown) for sampling an input signal 12 according to a sampling clock and stages of cascaded signal converters 14, 16, 18, . . . , 20 each for converting a respective portion of samples of the input signal 12 into digital codes B1, B2, B3 . . . , Bn. The accessory pipeline 42 further may include stages of error processors 24, 26, 28, . . . , 30, each stage of the error processors being coupled to a signal converter stage for extracting a summing node error from that signal converter stage. The pipelined ADC 10 also may include a digital aligner and corrector 22 for aligning and assembling digital codes B1, B2, . . . , into a digital output 44. Further, the digital aligner and corrector 22 may include processor circuits configured to correct the estimated amplifier gains based on the extracted errors.

In the main pipeline 40, the signal sampler may receive an analog input signal 12 and provide at its output a sample of the input signal 12 during a sampling clock cycle to the cascaded signal converters 14, 16, 18, . . . , 20. The sample may be in the form of a voltage signal. Each of the signal converters may be responsible for converting a certain portion of the sample of the input signal 12. These portions of the sample of the input signal 12 may be respectively converted into digital codes B1, B2, B3, . . . , Bn that may represent different levels of significance. Each of the B1, B2, . . . , Bn may include one or more bits. In one example embodiment, the output B1 of the signal converter 14 may correspond to the most significant bits, and the output of each subsequent stage may have progressively less significance until Bn of the signal converter 20 at stage N. The digital codes B1, B2, B3 . . . , Bn from signal converters 14, 16, 18, . . . , 20 may be supplied to the digital aligner and corrector 22 in which B1, B2, . . . , Bn may be aligned to form the digital output 44. As discussed in the '750 patent and in the following, the digital codes B1, B2, B3, . . . , Bn may contain errors caused by a finite gain of differential amplifiers in the signal converters. Errors at stages of more significant bits may be particularly troublesome because they may be propagated downstream to other stages. These errors contained in B1, B2, . . . , Bn may be related to summing node errors e1, e2, e3, . . . , en extracted from a summing node of the differential amplifier in each signal converter stage. The errors extracted from the accessory pipeline 42 may be provided to the digital aligner and corrector 22 to estimate amplifier gains therein. For example, the '750 patent described an LMS approach to estimate amplifier gains based on the errors at their summing nodes. In an alternative example, the pending patent application entitled "METHOD FOR MODIFYING THE LMS ALGORITHM TO REDUCE THE EFFECT OF CORRELATED PERTURBATIONS" (the content of which is incorporated by reference in its entirety) filed on the even date (U.S. patent application Ser. No. 13/159,679) by the same inventor of this application describes another LMS approach to estimate the gains.

Figure 2:
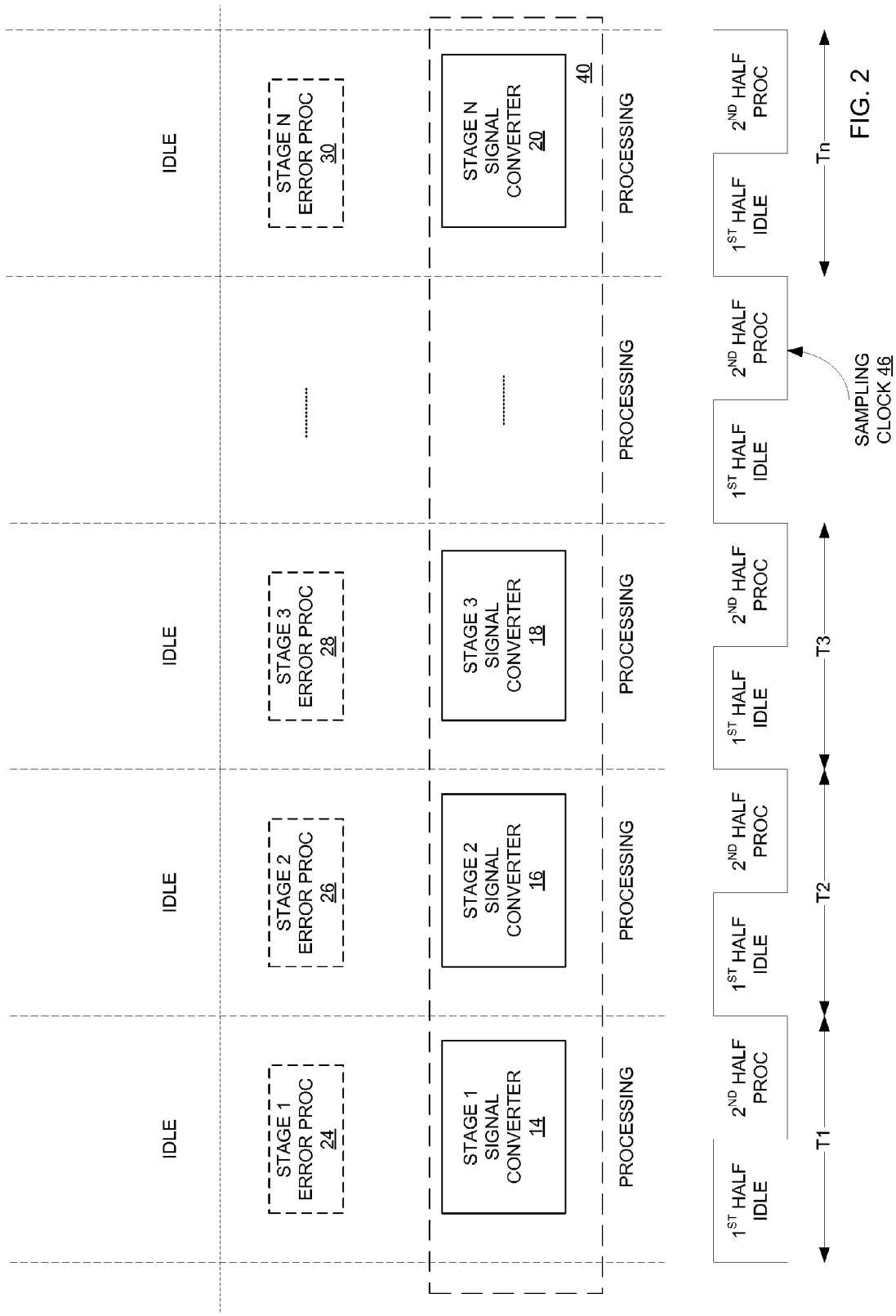
FIG. 2 illustrates operational phases of the pipelined ADC with an accessory pipeline as illustrated in FIG. 1.

FIG. 2 illustrates operational phases of the pipelined ADC with an accessory pipeline as illustrated in FIG. 1. In operation, the main pipeline 40 of cascaded signal converters may run according to the high speed sampling clock 46. The sampling clock 46 may include a sequence of clock cycles T1, T2, T3, . . . of equal duration. Each clock cycle may further include a first half and a second half. Thus, at a first half of clock cycle T1 (or the idle phase of stage 1) of the sampling clock 46, the signal converter 14 at stage 1 may receive a sample S1 from the signal sampler (not shown). At a second half of clock cycle T1 (or the processing phase of stage 1), signal converter 14 may convert a portion of S1 into a digital code B1, output the digital code B1 to the digital aligner and corrector 22, and output residual portions of S1 to signal convert 16 at stage 2. During a subsequent clock cycle T2, the signal converter 16 at stage 2 may similarly process the residual portions of sample S1. At a first half of clock cycle T2, signal converter 16 may receive the residual portions of S1. At a second half of clock cycle T2, signal converter 16 may convert a portion of the residual portions into digital code B2, output digital code B2 to the digital aligner and corrector 22 and output remaining residual portions of S1 to a next signal converter stage 18. Thus, each signal converter in the pipeline may be responsible for processing a portion of S1 during one clock cycle until the signal converter stage N processes the last portion of S1 at clock cycle Tn.

During clock cycle T2, the signal converter 14 at stage 1 may proceed to process next sample sampled from the analog input signal 12 and so on. In this way, the main pipeline may operate at a full speed of the sampling clock. The digital aligner and corrector 22 may, over n clock cycles, receive B1, B2, B3, . . . , Bn for a sample of the analog signal. The digital aligner and corrector 22 may provide appropriate delays to B1, B2, B3, . . . , Bn so that they may be properly aligned for an eventual digital output 28. Since the main pipeline runs at the high sampling rate, the digital aligner and corrector 22 may output the digital output 46 at the same sampling rate with a delay of n clock cycles.

Thus, for each signal converter stage of FIG. 2, the amplifier in the signal converter may only operate during the second half of a clock cycle (or the processing phase) and idle during the idle half of the clock cycle (or the idle phase). For each error processing stage, the error processor may operate according to an independent clock Ts. The independent clock Ts may have a frequency lower than or equal to the main sampling clock T. Thus, the error processors may be coupled to the main pipeline 40 occasionally. When the error processors are coupled to the main pipeline 40, the coupling may occur during the second half of the clock cycle (or the processing phase) of the main sampling clock T. It is noted that the accessory pipeline 42 including error processing stages 24, 26, 28, . . . , 30 may occupy additional circuit areas and consume additional powers. Further, the accessory pipeline 42 may exert loads to the main pipeline 40 that may adversely affect B1, B2, . . . , Bn. Applicant further notes that, during the idle phase, the signal converters in the main pipeline 40 may be used for error processing and thus eliminate the need for an additional accessory pipeline of error processing.

Figure 3:
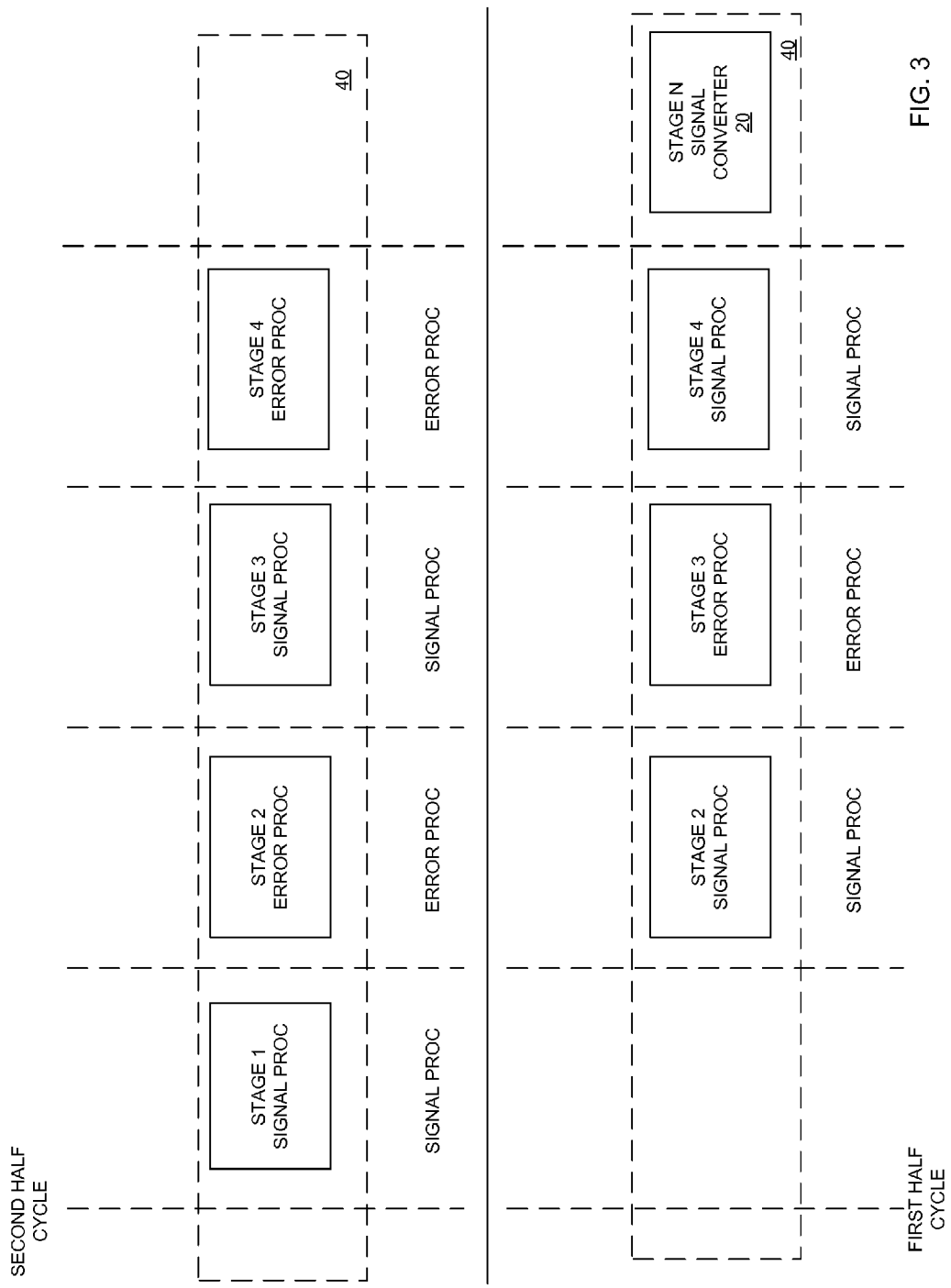
FIG. 3 illustrates a pipelined ADC with error calibration interleavingly using the main pipeline according to an exemplary embodiment of the present invention.

FIG. 3 illustrates a pipelined ADC with part of error processing performed in the main pipeline 40 according to an exemplary embodiment of the present invention. Through operation of switches, the main pipeline 40 may be configured to use idle signal converters as error processors and thus eliminate the need for an accessory pipeline for error processing. In one exemplary embodiment as illustrated in FIG. 3, through operation of switches, during the second halves of the sampling clock cycles, signal converter stages 1, 3, 5, . . . may be in the processing phase to convert their respective portions of sample signal, while, during the same second halves of the sampling clock cycles, signal converter stages 2, 4, . . . may process errors for their respective preceding signal converter stages (rather than stay in idle). Through operation of the switches, during the first halves of the sampling clock cycles, signal converter stages 2, 4, . . . , may be in the processing phase to convert their respective portions of sample signal, while, during the same first halves of the sampling clock cycles, signal converter stages 3, 5, . . . may process errors for their respective preceding signal converter stages. Since the signal converter stage 1 does not have a preceding stage, the signal converter stage 1 may stay in idle during the first halves of sampling clock cycles. Thus, the signal converter stages may operate in an interleaved manner to fully utilize all phases of the signal converter stages.

According to one exemplary embodiment of the present invention, the error processing may include operations of error amplification and/or error digitization. The error amplification may multiply errors from a previous stage with an amplification factor, and the error digitization may digitize the amplified errors through the same pipeline for gain estimation and error correction. Exemplary embodiments for error amplification and digitization are discussed later. According to an exemplary embodiment of the present invention, when errors are small, the errors at an earlier stage (such as stage 1) may be amplified for a number of stages before digitization starts. For example, the summing node errors at stage 1 may be amplified until stage 5 before the digitization of the amplified error starts from stage 6 to the last stage.

Figure 4:
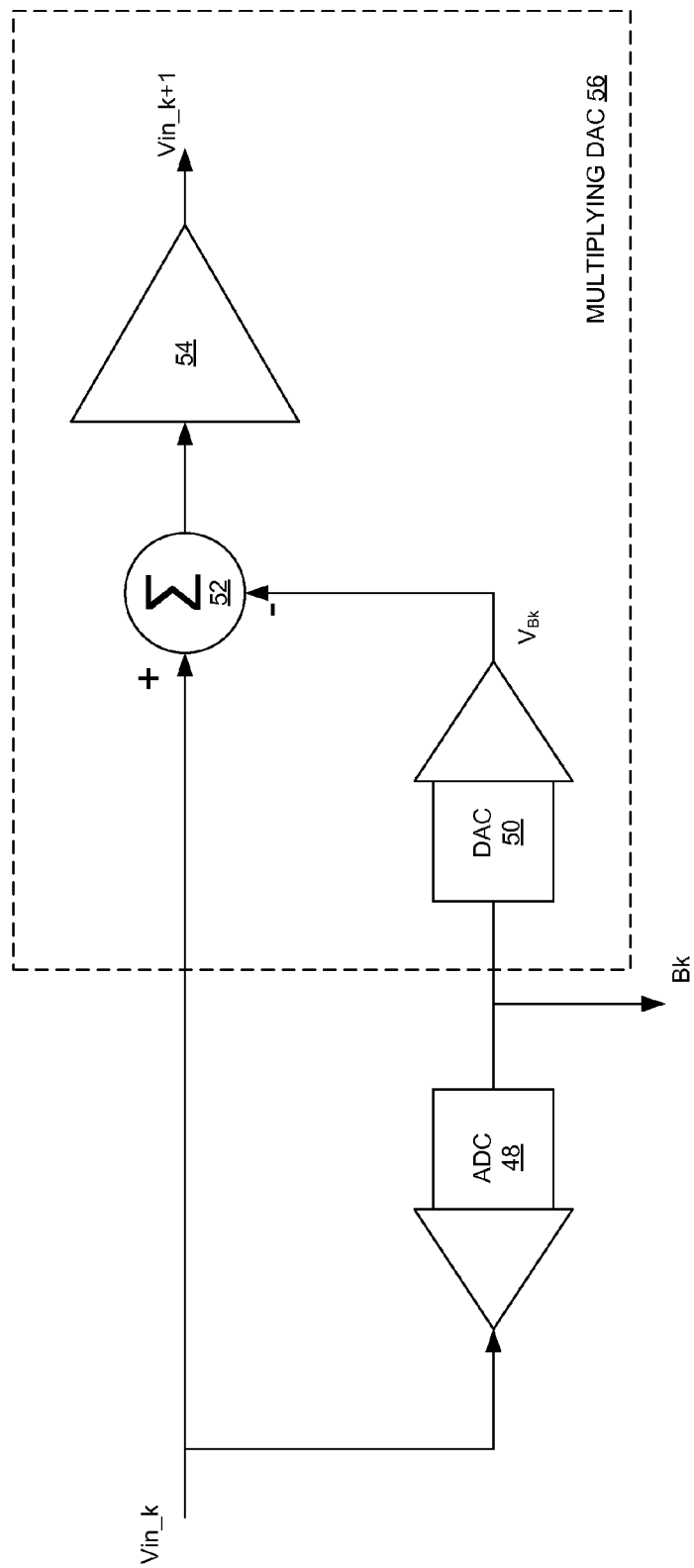
FIG. 4 illustrates a signal converter stage according to an exemplary embodiment of the present invention.

Different embodiments of signal converters may be used for the present invention. FIG. 4 illustrates a signal converter stage according to an exemplary embodiment of the present invention. The signal converter stage may be one of the signal converters of the main pipeline and is referred to as stage k for convenience. The signal converter k may include an ADC 48, a digital-to-analog converter (DAC) 50, an summer 52, and an amplifier 54.

The signal converter k may receive an input signal Vin_k from a preceding stage. ADC 48 may convert Vin_k into a digital code Bk as a digital output from this stage. The digital code Bk may correspondingly approximate the input voltage Vin_k (or the residual voltage output from the preceding stage). DAC 50 may be coupled to the ADC 48 to convert the digital codes Bk back into an analog voltage $V_{Bk}$ that may correspond to the digital codes Bk. The summer 52 may receive at its inputs Vin_k and $V_{Bk}$, and generate a residual signal Vin_k-$V_{Bk}$ which corresponds to the summing node error signal. The amplifier 54 may "gain" up the residual signal to generate an input Vin_k+1 (or Vout_k) for next stage k+1.

DAC 50, summer 52, and amplifier 54 may be collectively referred to as a multiplying DAC (MDAC) 56. FIGS. 5A-5D illustrate configurations of multiplying ADC (MDAC) circuits according to exemplary embodiments of the present invention. In these embodiments, the MDAC 56 are 3-bit converters for illustration purpose. Other types of converters (such as 1.5-bit) may also be constructed in similar manners.

Figure 5A:
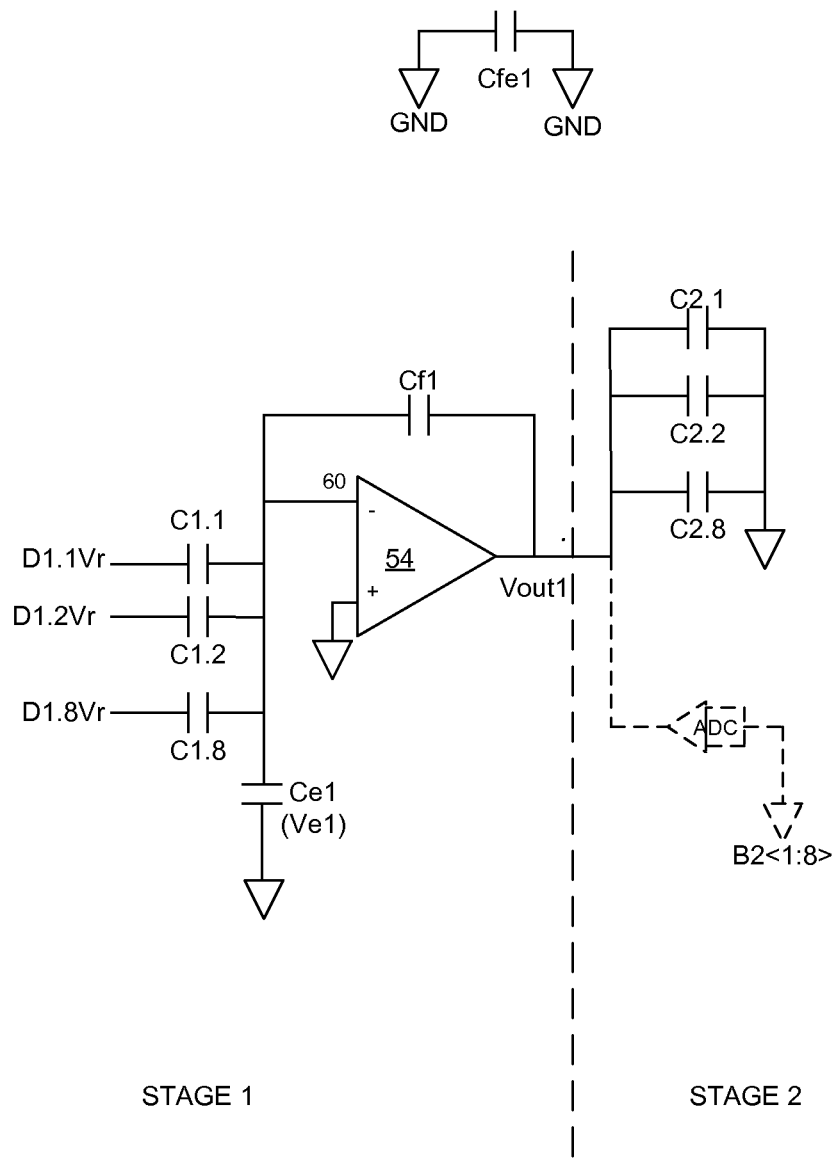
FIGS. 5A-5F illustrate configuration states of a multiplying ADC (MDAC) circuit according to an exemplary embodiment of the present invention.
Figure 5B:
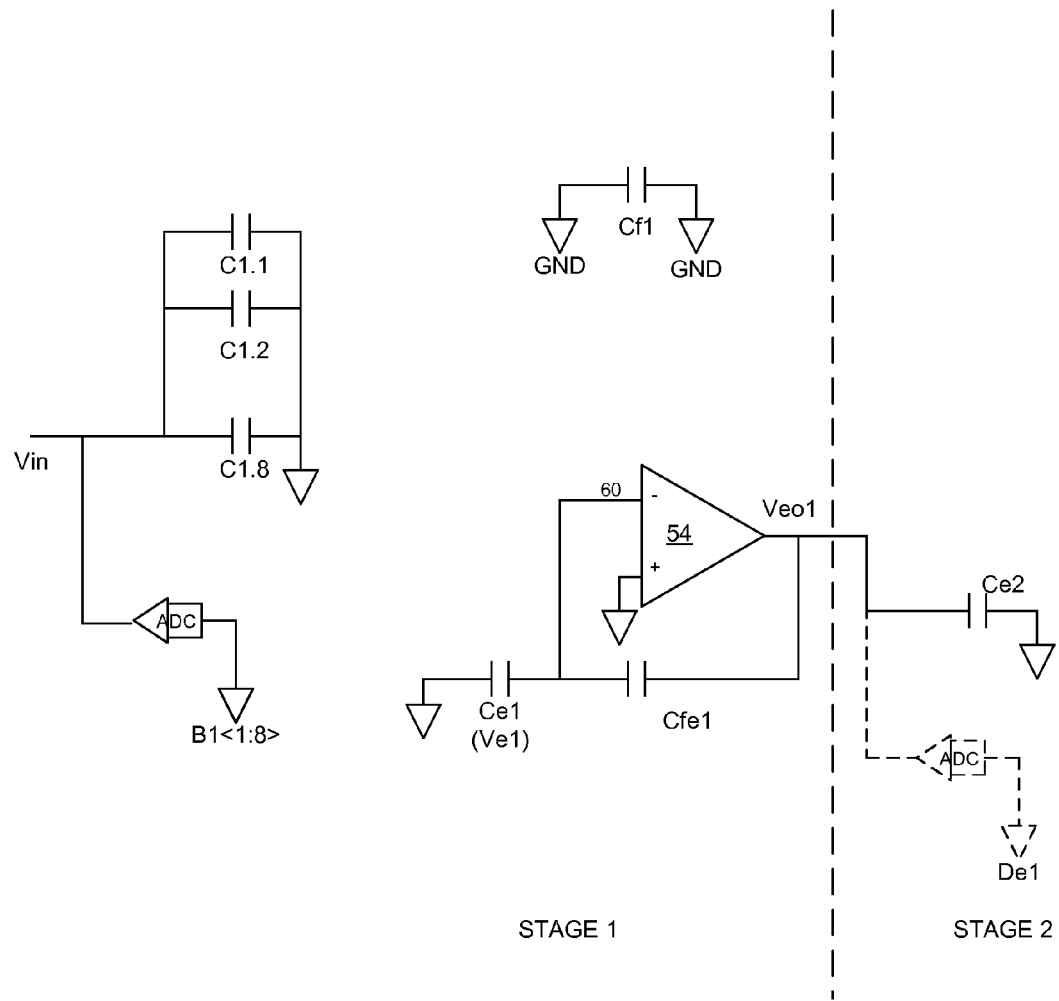

The each MDAC stage may include a number of capacitors Cf, Cfe C1, C2, ..., C8, an amplifier 54, and a number of switches (not shown). The switches may be grouped into two groups. In a first state, a first group of switches may be engaged to configure MDAC 56 into a first circuit configuration as an analog-to-digital signal conversion processing stage as illustrated in FIG. 5A. In a second state, a second group of switches may be engaged to configure MDAC 56 into a second circuit configuration as an error processing stage as illustrated in FIG. 5B. The MDAC 56 may be alternatively configured into the first or second state of circuit configurations as operation of the sampling clock. In one exemplary embodiment of the present invention, the first state of MDAC configuration may operate during the first half cycle of a clock cycle, and the second state of MDAC configuration may operate during the second half cycle of the clock cycle. For example, a leading edge of a first half of a clock cycle may trigger the first group of switches to engage and the second group of switches to disengage, and a leading edge of the second half of the same clock cycle may trigger the second group of switches to engage and the first group of switches to disengage.

As discussed above, the finite amplifier gains at MDAC stages may cause errors in the analog-to-digital conversion. It is one of the objects of the present invention to correct errors caused by finite amplifier gains.

FIG. 5A illustrates an exemplary first configuration of the MDAC stage 56 for ADC signal processing at stage 1 according to an embodiment of the present invention. The first configuration may be used for analog-to-digital signal conversion. While stage 1 is used here as an example, a person of ordinary skill in the art would have understood that the same principles may be applied to any one of the MDAC stages. Referring to FIG. 5A, input capacitors C1.1, C1.2, ..., C1.8 may be at one end coupled to a summing node 60 of the amplifier 54 and at the other ends be respectively supplied with voltages D1.1Vr, D1.2Vr, ..., D1.8Vr, each respectively corresponding to digital codes B1.1, B1.2, ..., B1.8 of this stage. The feedback capacitor Cf1 may be coupled between the summing node 50 and the output of the amplifier 54. Further, capacitor Ce1 may be coupled at one end to the summing node 60 and at the other end to a reference such as ground. Capacitor Cfe1 may be reset. The input capacitors C1.1, C1.2, ..., C1.8, the feedback capacitor Cf1, and the amplifier 54 may form a circuit configuration that outputs a voltage signal Vout1 for the following stage 2 of signal converter. When the gain of the amplifier 54 is ideal—i.e., infinite, the output voltage Vout1 correspond to the residual (Vin-DVr1) multiplied by a gain G, where DVr1 represents the combination of D1.1Vr, D1.2Vr, ..., D1.8Vr, and the gain G is determined by a ratio between Cf1 and a combination of the input capacitors C1.1, C1.2, ..., C1.8. However, in practice, the amplifier 54 may have a finite gain A rather than an infinite gain. The finite gain A may introduce an additional error term of G*Vin/A to Vout1 for subsequent stages. As discussed in the '750 patent, this error term is proportional to the summing node voltage. Thus, capacitor Ce1 may be coupled to the summing node to extract and store an error term Ve1 for later error processing.

FIG. 5B is an exemplary second configuration of the MDAC stage for error processing according to an embodiment of the present invention. In this configuration, the eight input capacitors C1.1, C1.2, ..., C1.8 may be coupled to the input Vin while the feedback capacitor Cf1 may be reset. At the same time, instead of idling, amplifier 54 may be utilized in the second configuration for error processing. Error processing may include error amplification and error digitization. Since the extracted error Ve1 initially may be too small to be accurately digitized, it may preferably amplify the error for a number of stages before digitization. FIG. 5B illustrates an exemplary error amplification circuit configuration under which capacitor Ce1, charged with Ve1, may be coupled to the summing node 60, and capacitor Cfe1 may be coupled from the summing node 60 to the output of amplifier 54. Thus, the error voltage Ve1 extracted and stored in Ce1 during the first circuit configuration as shown in FIG. 5A may be amplified to output Veo1. The amplification factor Ge is determined by the capacitance ratio between Cfe1 and Ce1. The amplified error Veo1 may be passed to a capacitor Ce1 in the subsequent MDAC stage 2 for further error processing. Thus, in this way, the main pipeline 40 may be utilized to amplify errors during the previously "idle" phase. Alternatively, instead of further error amplification, the error may be digitized at stage 2 via the analog-to-digital converter (ADC) (shown in dashed lines). The digitized error De1 is discussed in detail in subsequent paragraphs.

Figure 5C:
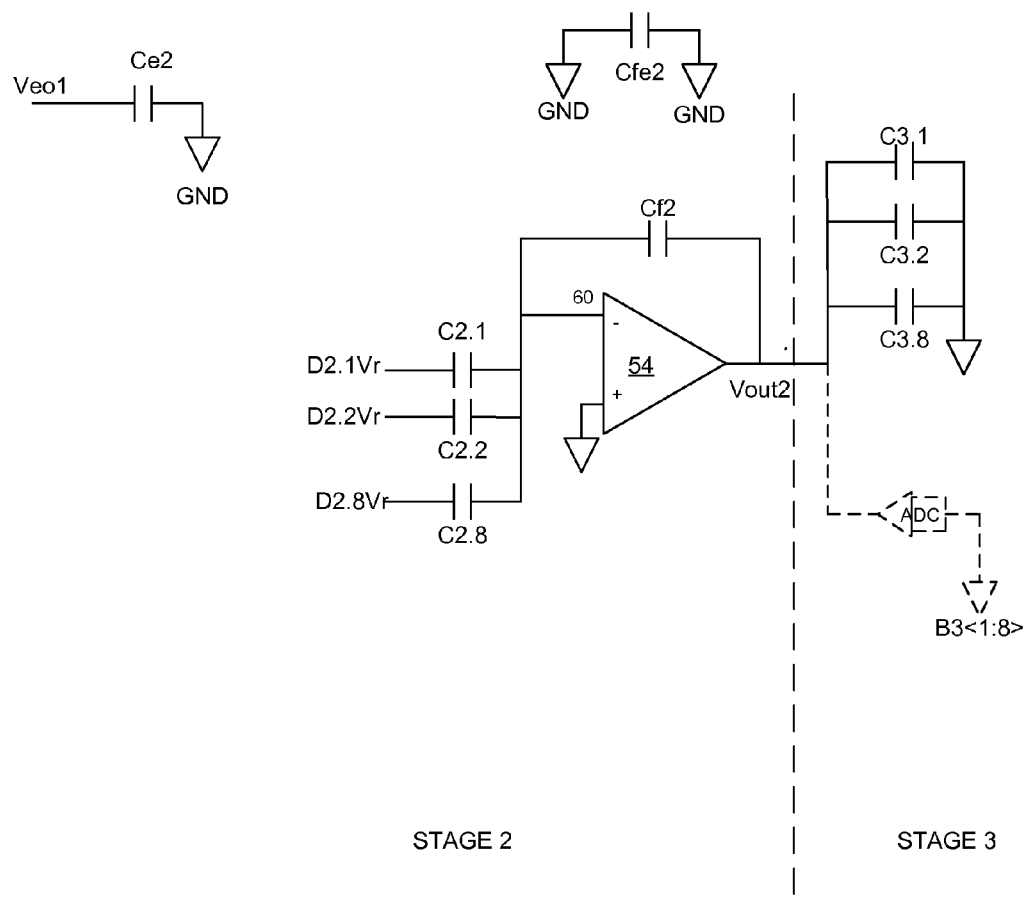

After receiving the residual portion (Vout1) of the input and the amplified error Veo1 respectively in two half cycles of clock, MDAC stage 2 may further perform analog-to-digital conversion for the residual portion Vout1 and error processing for the amplified error Veo2. FIG. 5C illustrates an exemplary first configuration of MDAC stage 2 according to an embodiment of the present invention. Capacitors C2.1, C2.2, . . . , C2.8 may be at one end coupled to a summing node 60 of the amplifier 54 and at the other ends be respectively supplied with voltages D2.1Vr, D2.2Vr, . . . , D2.8Vr, each respectively corresponding to digital output B1.1, B2.2, . . . , B2.8 of this stage. The feedback capacitor Cf2 may be coupled between the summing node 60 and the output of the amplifier 54. Thus, an output Vout2 corresponding to a further residual of (Vout1-DVr2) may be produced at the output the amplifier 54. This residual Vout2 may be charged to capacitors C3.1, C3.2, . . . , C3.8 of MDAC stage 3.

Figure 5D:
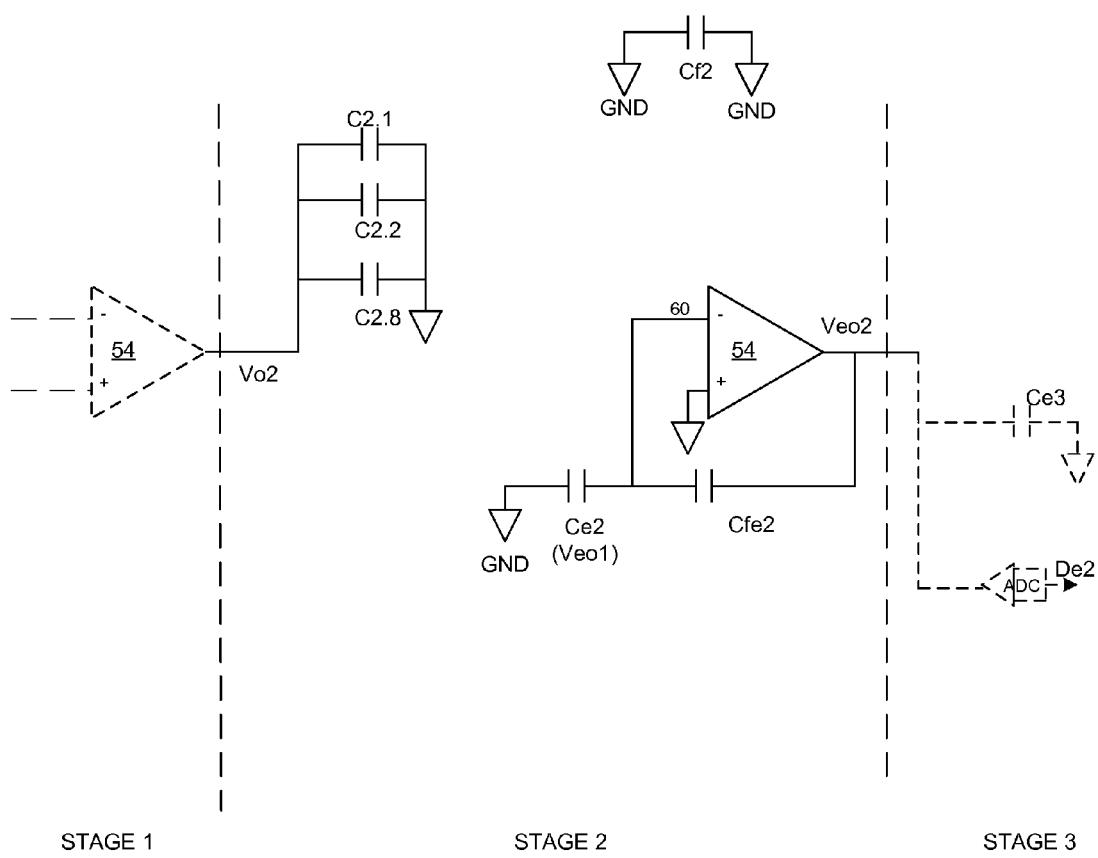

MDAC stage 2 may operate in opposite to MDAC stage 1. Thus, when MDAC stage 2 operates in the first configuration of analog-to-digital conversion, MDAC stage 1 operates in the second configuration of error processing. Under the first configuration of MDAC stage 2, a capacitor Ce2 may be coupled to the output of MDAC stage 1 to receive the amplified error Veo1. In one embodiment, the amplified error is not digitized immediately at stage 2. Instead, the error Veo1 may be amplified further before it is digitized in one of the succeeding signal converter stages. FIG. 5D illustrates an exemplary second configuration for MDAC stage 2 according to an embodiment of the present invention. Capacitor Ce2 charged with Veo1 may be coupled to the summing node 60 of this MDAC stage. Capacitor Cfe2 may be coupled between the summing node and an amplifier output. Thus, Veo1 may be further amplified to produce an output of Veo2 which may charge a capacitor Ce3 at stage 3.

Figure 5E:
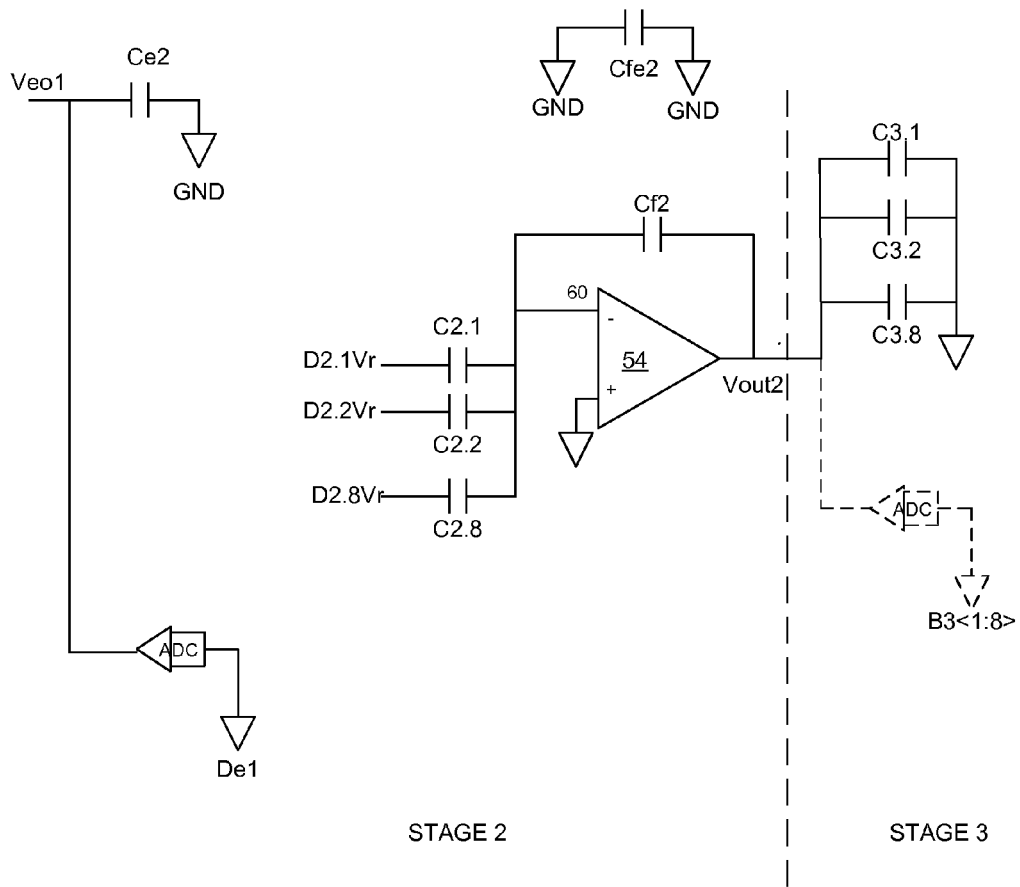
Figure 5F:
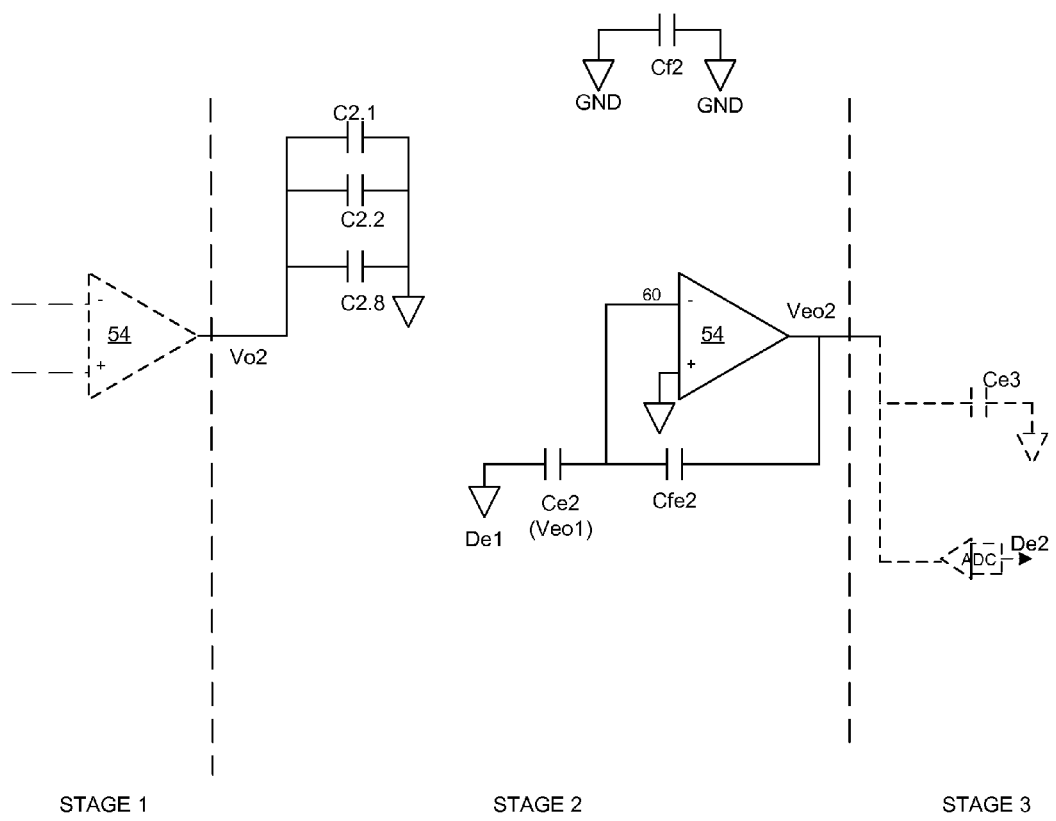

In an alternative embodiment, the amplified error Veo1 may be digitized using ADC at stage 2. FIG. 5E illustrates an exemplary first configuration of MDAC stage 2 that includes error digitization according to an embodiment of the present invention. In this alternative embodiment, while capacitor Ce2 is charged with Veo1, the amplified error Veo1 from stage 1 may be digitized by the ADC of stage 2 to generate digital code De1 for the error Veo1. Thereafter, the error Voe1 may be digitized through the main pipeline in a manner similar to the analog-to-digital conversion of the input signal, except for that the error digitization occurs during the first configuration of a succeeding stage. FIG. 5F illustrates an exemplary second configuration for MDAC stage 2 according to the alternative embodiment of the present invention. Capacitor Ce1 may be coupled to a voltage representing the digitized error De1 at one end and to the summing node at the other end. In this alternative embodiment, the output Veo2 may correspond to a residual error of (Veo1-De1) which may be further digitized in the following stages in a pipelined manner.

Figure 6:
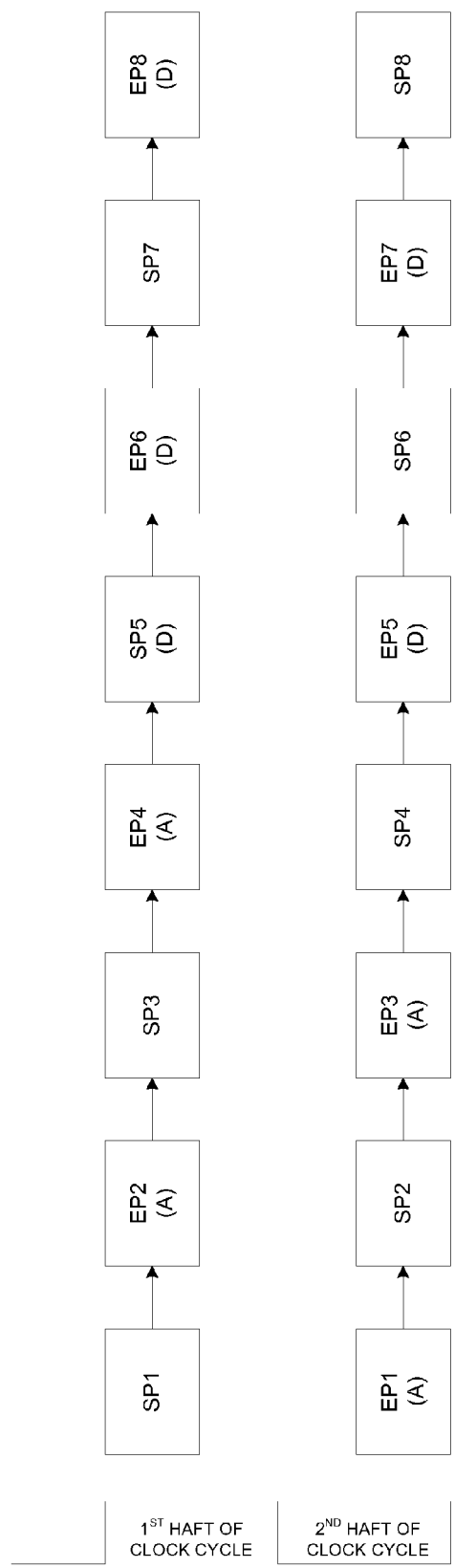
FIG. 6 illustrates a pipelined ADC having MDAC stages in different configuration states according to exemplary embodiments of the present invention.

Thus, MDAC circuit 56 may be configured, via switches, to a first configuration for processing the input sample (analog-to-digital conversion), and extracting errors accumulated in a previous stage. Further, it may be configured to a second configuration for error processing of error amplification and pipelined digitization. It is noted that consecutive two signal converter stages may be configured to complement each other. Thus, if the present stage operates in the first configuration, the succeeding stage operates in the second configuration, and if the present stage operates in the second configuration, the succeeding stage operates in the first configuration. FIG. 6 shows a main ADC pipeline that is configured to have alternative signal processing and error processing stages.

Referring to FIG. 6, during a first half of a clock cycle, MDAC stages 1, 3, 5, and 7 are configured to process the input sample (analog-to-digital conversion) while MDAC stages 2, 4, 6, and 8 are configured to perform error processing. During a second half of the clock cycle, MDAC stages 1, 3, 5, and 7 are configured to perform error processing, while MDAC stages 2, 4, 6, and 8 are configured to process the input sample (analog-to-digital conversion).

As discussed above, error processing may be configured so that the first few stages perform only error amplification. Once the error is amplified to a certain level that may be reliably digitized, error digitization may start. In one exemplary embodiment, the error may be amplified to a level that is in the same order of the analog input signal before the digitization starts. In the exemplary embodiment of FIG. 6, the errors from stage 1 may be amplified until stage 4 and error digitization starts from stage 5. After stage 5, the error from stage 1 may be digitized through the pipeline. In other embodiments, errors from other stages (such as stage 2 or stage 3) may be similarly amplified and digitized so that the finite gain at these other stages may be estimate. In one embodiment, the error processing may start for stage N (N is a natural number) and work down to stage 1 to correct errors in each stage N to stage 1. Alternatively, the error processing may start randomly from stages 1 to N.

Figure 7A:
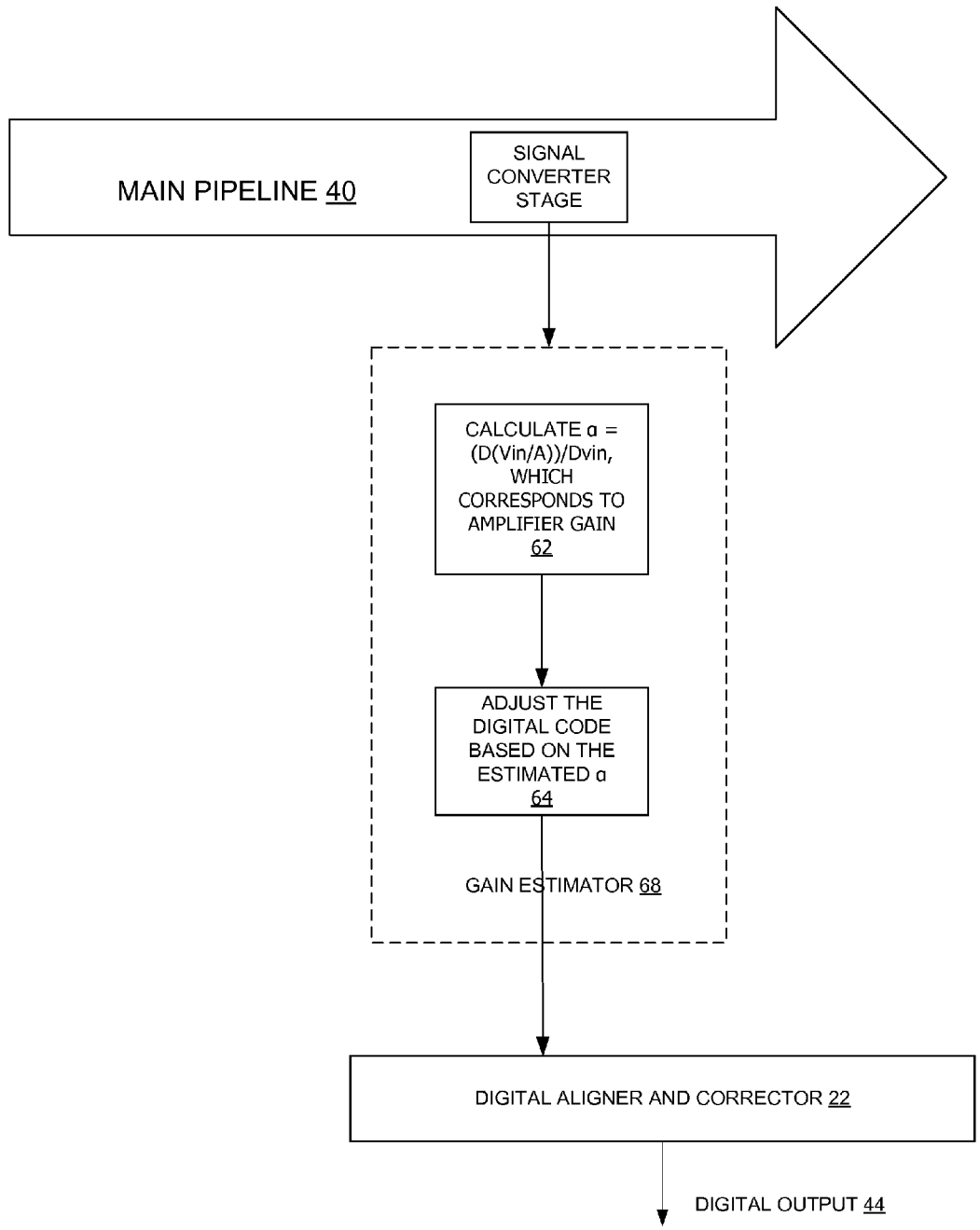
FIG. 7A illustrates a gain estimator directly coupled to the main pipeline according to an exemplary embodiment of the present invention.

A gain estimator may be directly coupled to signal converter stages in the main pipeline 40 to receive the digitized error. The gain estimator may be selectively coupled to the stage via a switch controlled according to an independent clock. In a preferred embodiment, the independent clock may occur at a rate slower than or equal to the sampling clock of the main pipeline 40 either periodically or randomly. The error signal sampled from the signal converter stage may be used for error calibration. FIG. 7A illustrates a gain estimator 70 that may calibrate errors by digitally compensating the error according to an exemplary embodiment of the present invention. In FIG. 7A, the gain estimator 70 may receive digitized error signal D(Vin/A) of its summing node error signal Vin/A. The processing units in the gain estimator 68 further may, at 62, calculate a ratio factor a=D(Vin/A)/D(Vin), where Vin is the voltage input for the signal converter stage. Based on the ratio factor a, the processing units in the gain estimator 68 further may, at 64, adjust the digital codes supplied to the digital aligner and corrector 22. Thus, errors in the eventual digital output 44 caused by the finite amplifier gain in the signal converter stage may be corrected digitally.

Figure 7B:
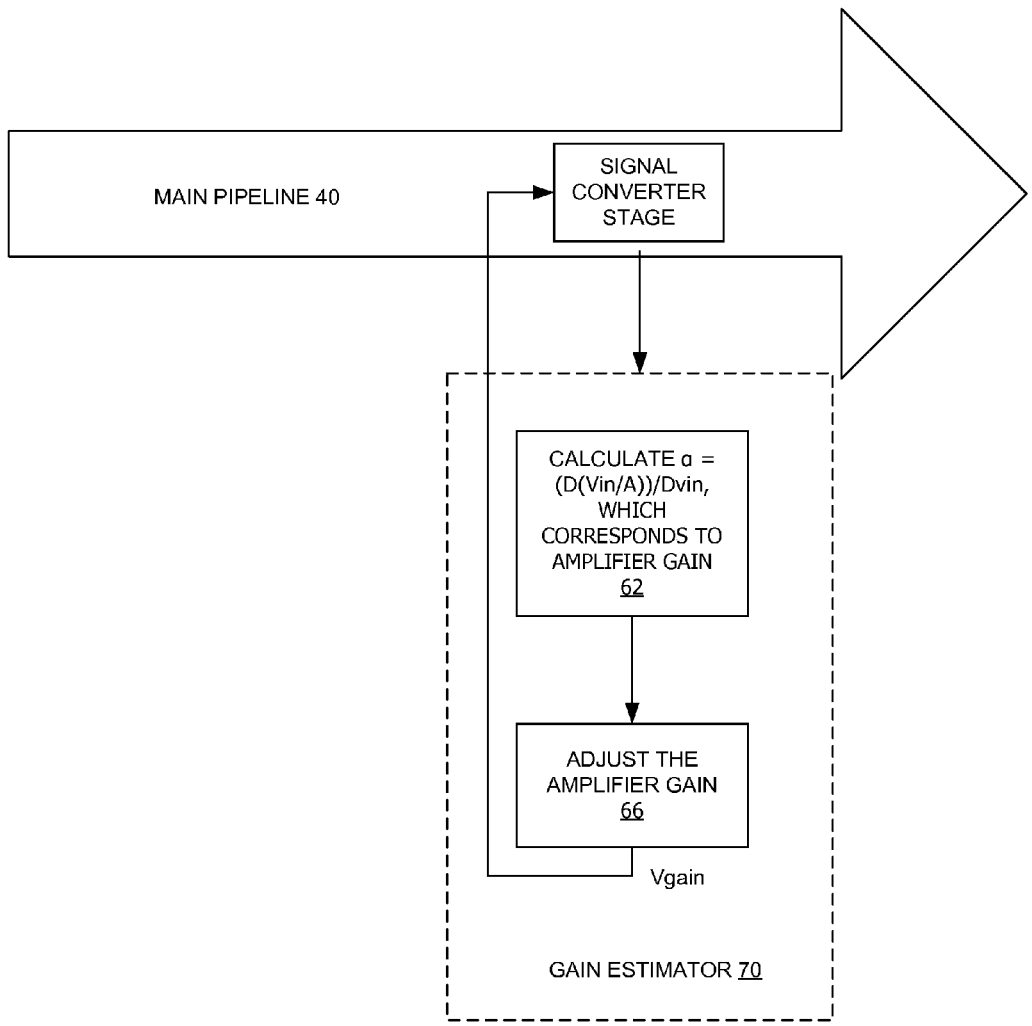
FIG. 7B illustrates another gain estimator directly coupled to the main pipeline according to an exemplary embodiment of the present invention.

Alternatively, errors caused by the finite amplifier gain in the signal converter stage may be corrected in an analog manner. FIG. 7B illustrates a gain estimator 70 that may calibrate errors by adjusting the amplifier gain towards working at maximum gain spot according to an exemplary embodiment of the present invention. Similar to the gain estimator 68 as shown in FIG. 7A, the gain estimator 70 may receive digitized error signal D(Vin/A) of its summing node error signal Vin/A. The processing units in the gain estimator 70 further may, at 62, calculate a ratio factor α=D(Vin/A)/D(Vin), where Vin is the voltage input for the signal converter stage. However, at 66, the gain estimator 70 may provide a feedback voltage Vgain to the signal converter stage to keep the amplifier in the stage to work at a maximum gain spot (an optimal working condition) regardless changes in current supply and temperature. This optimal working condition of the amplifier may be achieved by using an LMS method to iteratively minimize an estimated α. The LMS method may be one as described in the co-pending patent application that is incorporated by reference entitled "METHOD FOR MODIFYING THE LMS ALGORITHM TO REDUCE THE EFFECT OF CORRELATED PERTURBATIONS" (Ser. No. 13/159,679).

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. An analog-to-digital converter (ADC) system for converting an input, comprising:
    a pipeline including successively-cascaded signal converter stages, each signal converter stage including an analog-to-digital converter (ADC) for converting a portion of the input into digital codes and a multiplying digital-to-analog converter (MDAC) for outputting a residual portion of the input to a following signal converter stage, the MDAC including an amplifier having a summing node and operating alternatively in a first circuit configuration and a second circuit configuration,
    wherein:
        for a present signal converter stage, a summing node error is capacitively extracted under the first configuration of the MDAC of the present signal converter stage,
        the extracted summing node error is amplified by the amplifier in a succeeding second configuration of the MDAC of the present signal converter stage to output an amplified error to a following signal converter stage,
        the amplified error is amplified in a second configuration of following signal converter stages, and
        an error estimator is coupled to the pipeline to receive the amplified error and to adjust a gain of the amplifier based on the amplified error.

2. The ADC system of claim 1, wherein the amplified error is one of an analog error and a digital error.

3. The ADC system of claim 1, further comprising:
    a code aligner/corrector that temporally aligns and corrects the digital codes received from the successively-cascaded signal converters to provide a digital out of the ADC system.

4. The ADC system of claim 1, wherein the error estimator calculates the amplifier gain based on the amplified error up to the one of the signal converters.

5. The ADC system of claim 1, wherein the error estimator calculates a ratio factor between the summing node error and the input, and wherein the amplifier gain is adjusted based on the ratio factor.

6. The ADC system of claim 1, wherein the gain of the amplifier is adjusted to a maximum gain.

7. The ADC system of claim 1, wherein the gain of the amplifier is adjusted to a maximum gain regardless of changes in current supply and temperature.

8. The ADC system of claim 1, wherein the MDAC in the each signal converter switches between the first and second circuit configurations via a plurality of switches controlled according to a first clock.

9. The ADC system of claim 1, wherein the error estimator is selectively coupled to the pipeline according to a second clock which is independent of the first clock.

10. The ADC system of claim 1, wherein the first circuit configuration occurs during one of a first half clock cycle and a second half clock cycle of the first clock, and the second circuit configuration occurs during an opposite half clock cycle of the first circuit configuration.

11. The ADC system of claim 1, wherein signal converter stages in the pipeline operate alternatively in the first and second configurations.

12. A method for analog-to-digital conversion, comprising:
    providing a pipeline including successively-cascaded signal converter stages, each signal converter stage including an analog-to-digital converter (ADC) for converting a portion of an input into digital codes and a multiplying digital-to-analog converter (MDAC) for outputting a residual portion of the input to a following signal converter stage, the MDAC including an amplifier having a summing node and operating alternatively in a first circuit configuration and a second circuit configuration,
    wherein:
        for a present signal converter stage, a summing node error is capacitively extracted under the first configuration of the MDAC of the present signal converter stage,
        the extracted summing node error is amplified by the amplifier in a succeeding second configuration of the MDAC of the present signal converter stage to output an amplified error to a following signal converter stage,
        the amplified error is amplified in a second configuration of following signal converter stages, and
        providing an error estimator coupled to the pipeline to receive the amplified error and to adjust a gain of the amplifier based on the amplified error.

13. The method of claim 12, wherein the amplified error is one of an analog error and a digital error.

14. The method of claim 12, further comprising:
    providing a code aligner/corrector that temporally aligns and corrects the digital codes received from the successively-cascaded signal converters.

15. The method of claim 12, wherein the error estimator calculates a ratio factor between the summing node error and the input, and wherein the amplifier gain is adjusted based on the ratio factor.

16. The method of claim 12, wherein the gain of the amplifier is adjusted to a maximum gain.

17. The method of claim 12, wherein the gain of the amplifier is adjusted to a maximum gain regardless of changes in current supply and temperature.

18. The method of claim 12, wherein the MDAC in the each signal converter switches between the first and second circuit configurations via a plurality of switches controlled according to a first clock.

19. The method of claim 12, wherein the error estimator is selectively coupled to the pipeline according to a second clock which is independent of the first clock.

20. An analog-to-digital converter (ADC) system for converting an input, comprising:
    means for successively cascading signal converter stages, each signal converter stage including an analog-to-digital converter (ADC) for converting a portion of the input into digital codes and a multiplying digital-to-analog converter (MDAC) for outputting a residual portion of the input to a following signal converter stage, the MDAC including an amplifier having a summing node and operating alternatively in a first circuit configuration and a second circuit configuration, wherein for a present signal converter stage, a summing node error is capacitively extracted under the first configuration of the MDAC of the present signal converter stage, the extracted summing node error is amplified by the amplifier in a succeeding second configuration of the MDAC of the present signal converter stage to output an amplified error to a following signal converter stage, and the amplified error is amplified in a second configuration of following signal converter stages; and means for receiving the amplified error and to adjust a gain of the amplifier based on the amplified error.

* * * * *